US006623152B1

(12) United States Patent
Kroening

(10) Patent No.: US 6,623,152 B1
(45) Date of Patent: Sep. 23, 2003

(54) DISPLAY ELEMENT CAPABLE OF BEING MOUNTED ON A PRINTED CIRCUIT BOARD

(75) Inventor: Geräld Kroening, Haan (DE)

(73) Assignee: Mentor GmbH & Company, Erkrath (DE)

( * ) Notice: Subject to any disclaimer, the term of this patent is extended or adjusted under 35 U.S.C. 154(b) by 0 days.

(21) Appl. No.: 09/723,946

(22) Filed: Nov. 28, 2000

(30) Foreign Application Priority Data

Dec. 8, 1999 (EP) .............................. 99124495
Feb. 23, 2000 (EP) .............................. 00103764

(51) Int. Cl.[7] .................................. F21V 8/00
(52) U.S. Cl. .................. 362/555; 362/32; 362/800; 362/558; 362/226; 362/26
(58) Field of Search .................. 362/558, 555, 362/581, 800, 226, 26, 32; 257/98, 99; 361/760

(56) References Cited

U.S. PATENT DOCUMENTS 4,575,785 A  *  3/1986  Lerude et al. ............. 362/226
RE34,254 E   *  5/1993  Dragoon ................... 362/307
5,327,328 A  *  7/1994  Simms et al. .............. 362/26
5,331,512 A  *  7/1994  Orton ...................... 362/760
5,388,035 A  *  2/1995  Bodem, Jr. ................ 362/61
5,481,440 A  *  1/1996  Oldham et al. ............. 362/32

FOREIGN PATENT DOCUMENTS

DE  0403764 A1  4/1990
EP  0421824 A1  5/1990
EP  0751340 A2  2/1997

* cited by examiner

Primary Examiner—Sandra O'Shea
Assistant Examiner—Anabel Ton
(74) Attorney, Agent, or Firm—Patterson, Thuente, Skaar, & Christensen, P.A.

(57) ABSTRACT

The invention relates to a display element capable of being mounted on a printed circuit board, having an LED and a device for illuminating a light exit area. It comprises an optical waveguide forming the illuminating device and the light exit area, which optical waveguide has a recess, which has a light coupling-in area for light from the LED and in which the LED is fixed.

24 Claims, 6 Drawing Sheets

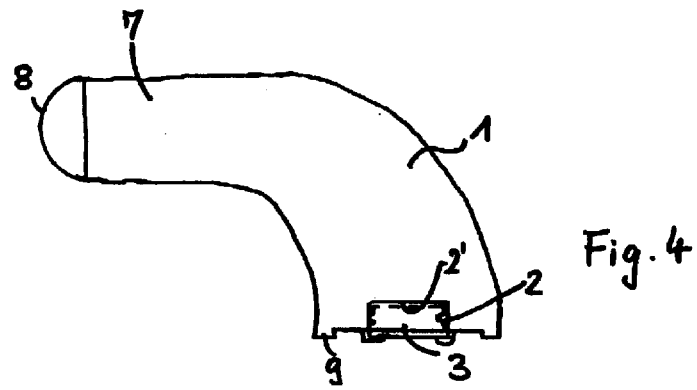
Fig. 4
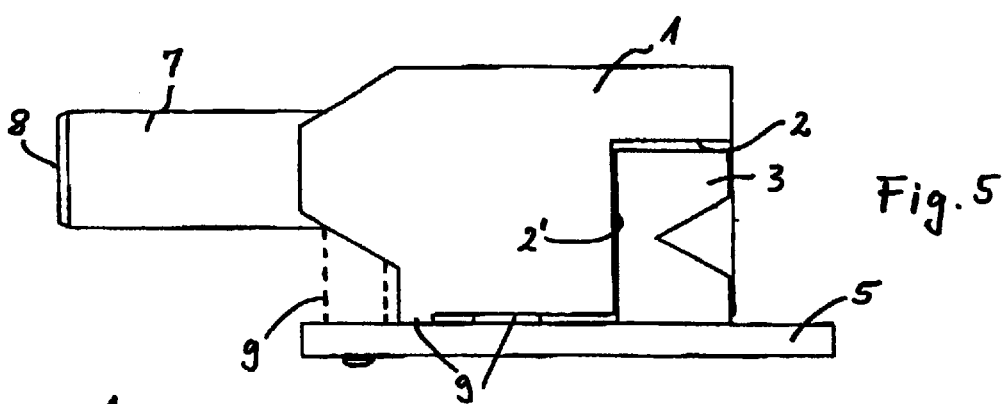
Fig. 5
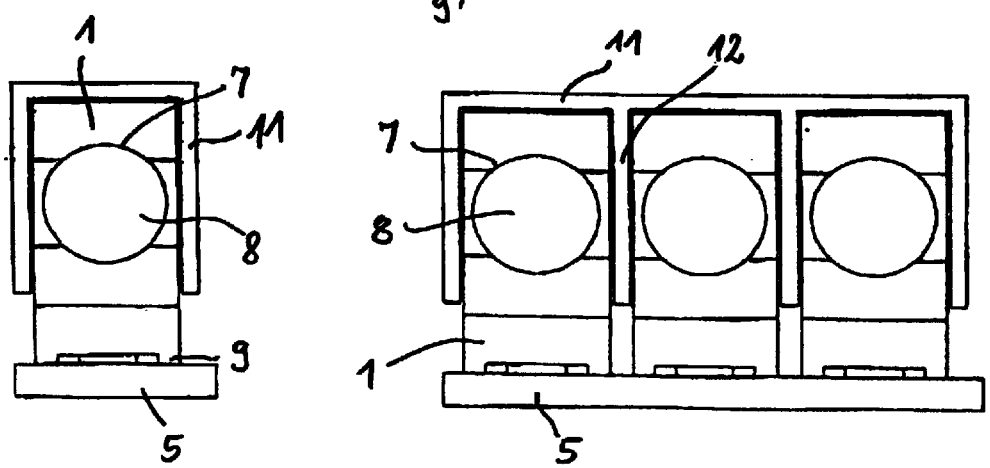
Fig. 6
Fig. 7

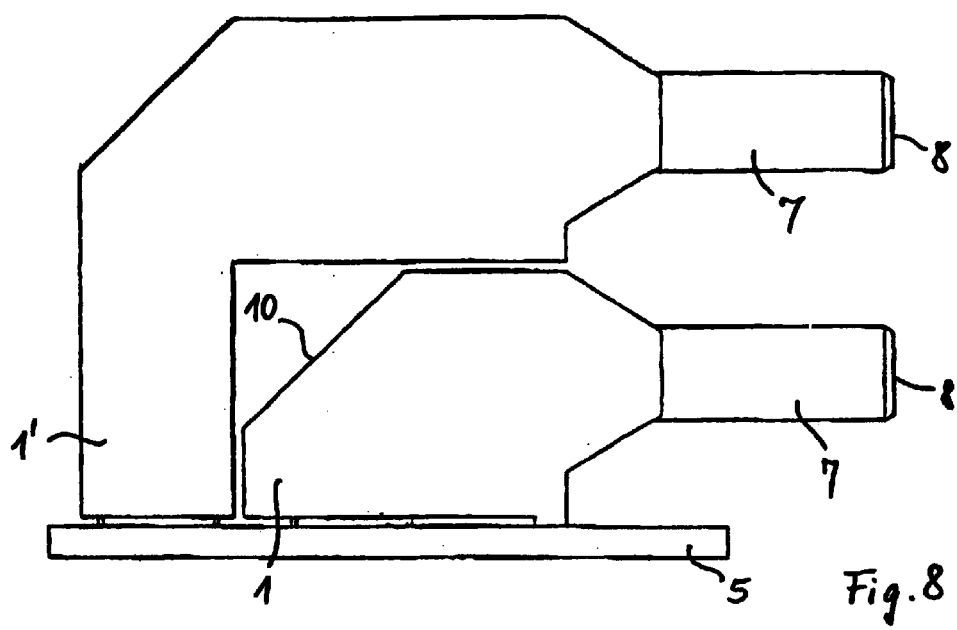
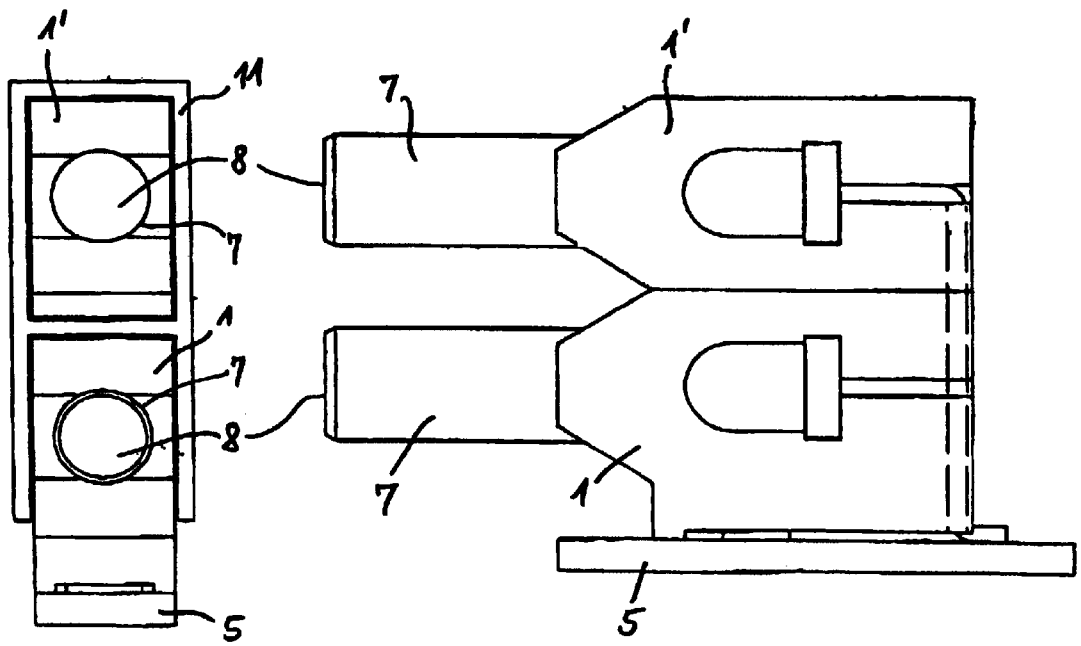

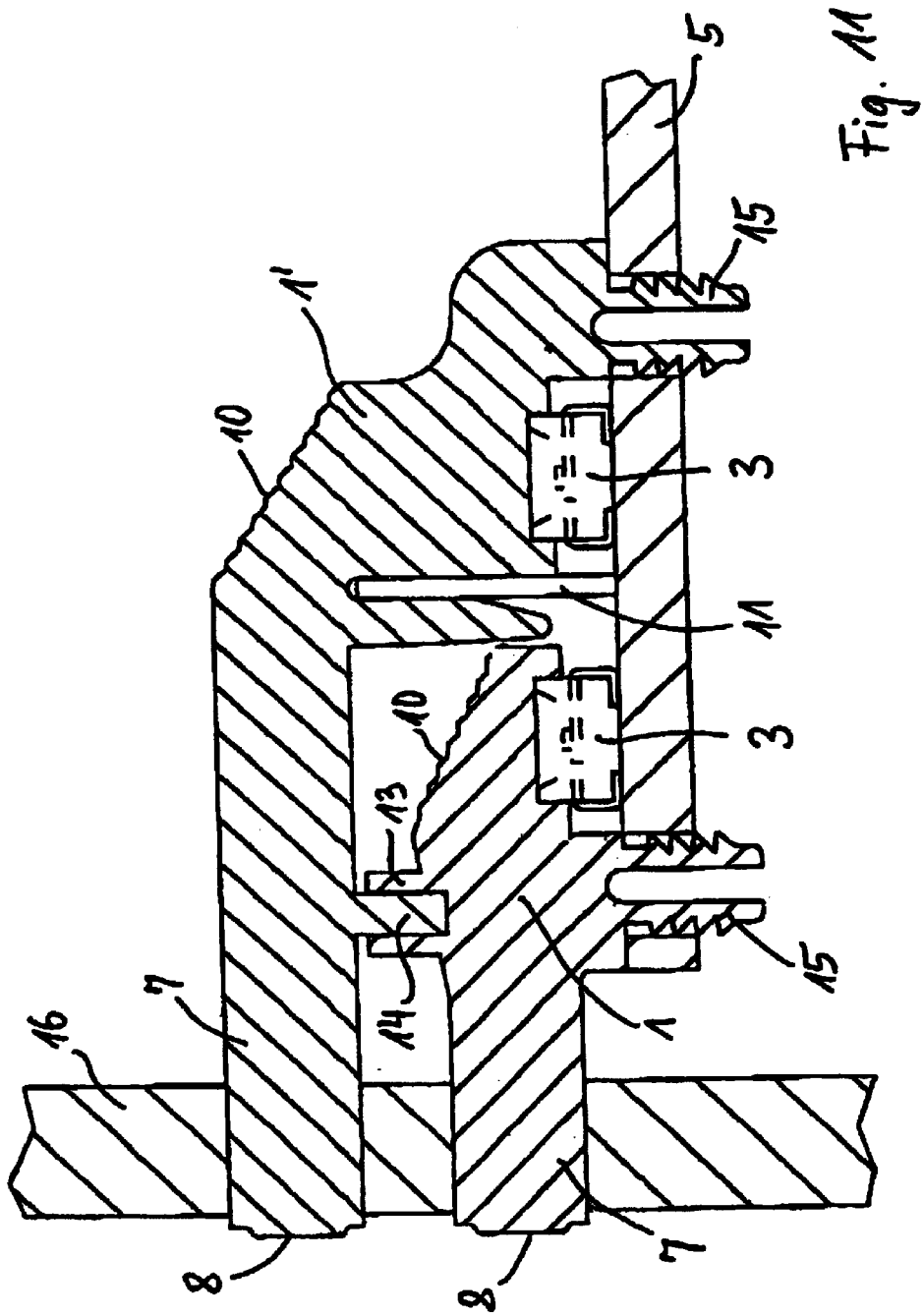

DISPLAY ELEMENT CAPABLE OF BEING MOUNTED ON A PRINTED CIRCUIT BOARD

FIELD OF THE INVENTION

The invention relates to a display element capable of being mounted on a printed circuit board. Such display elements allow to display certain information provided by the illumination of light sources like LED's in an area or plane in front of or adjacent to the printed circuit board by guiding the light from the light source to the display area.

BACKGROUND OF THE INVENTION

European Patent EP 0 421 824 B1 discloses a display element which serves to be fitted on printed circuit boards using SMD technology and comprises a housing having a T-shaped opening. In this case, the T-shaped opening accommodates an LED (light-emitting diode) at the end facing the printed circuit board, while another end accommodates a lens which projects from the housing and, opposite from the LED, has a slanted face adjacent to which a plastics composition is filled into the T-shaped opening from the third end thereof. This forms an inner area which reflects incident light from the LED to the exit end of the lens. In this case, the LED forms the base of the display element and serves for fixing the latter on a printed circuit board. A display element of this type has a relatively complicated structure, especially as it comprises three individual parts and the plastics composition which have to be assembled to form the display element.

SUMMARY OF THE INVENTION

It is an object of the invention to provide a display element which can be produced in a substantially simplified manner.

Thus, the invention concerns a display element capable of being mounted on a printed circuit board, comprising:

- at least one LED provided with connecting wires;
- a device for illuminating a light exit area extending substantially perpendicularly to the direction of light propagation;
- an optical waveguide forming said illuminating device and the light exit area;
- wherein said optical waveguide has a recess, which has a light coupling-in area for light from the at least one LED and in which the at least one LED is fixed;
- said optical waveguide having at least one supporting element for support on a printed circuit board;
- wherein the connecting wires of the at least one LED have feet which preferably can be soldered onto the printed circuit board by means of SMD technology.

By virtue of the fact that the display element used is an optical waveguide which accommodates the LED and forms the light exit area, and thus the display area, only two structural parts that are simple to connect to one another are required for the display element, and a separate housing as in the case of EP 0 421 824 B1 into which different parts can be inserted and a plastics composition can be introduced is not required. This considerably simplifies production, to be precise irrespective of the type of LED used or of the desired fitting on a printed circuit board, i.e. technologies other than the SMD technology can also be used.

Further objects, advantages and embodiments of the invention will become apparent from the following description and from the claims.

BRIEF DESCRIPTION OF THE DRAWINGS

The invention will be explained in more detail hereinbelow with reference to exemplary embodiments illustrated schematically in the attached drawings.

FIGS. 3 to 5 show further embodiments of a display element of the invention in side view.

FIGS. 6 and 7 show front views of further embodiments of the invention.

FIG. 8 shows a side view of an embodiment of display elements of the invention which are arranged one above the other.

FIG. 9 shows a front view of a variant of the embodiment of FIG. 8.

FIGS. 10 and 11 show, in a side view and in section, respectively, further embodiments of display elements of the invention arranged one above the other.

DETAILED DESCRIPTION OF PREFERRED EMBODIMENTS

Figure 1:
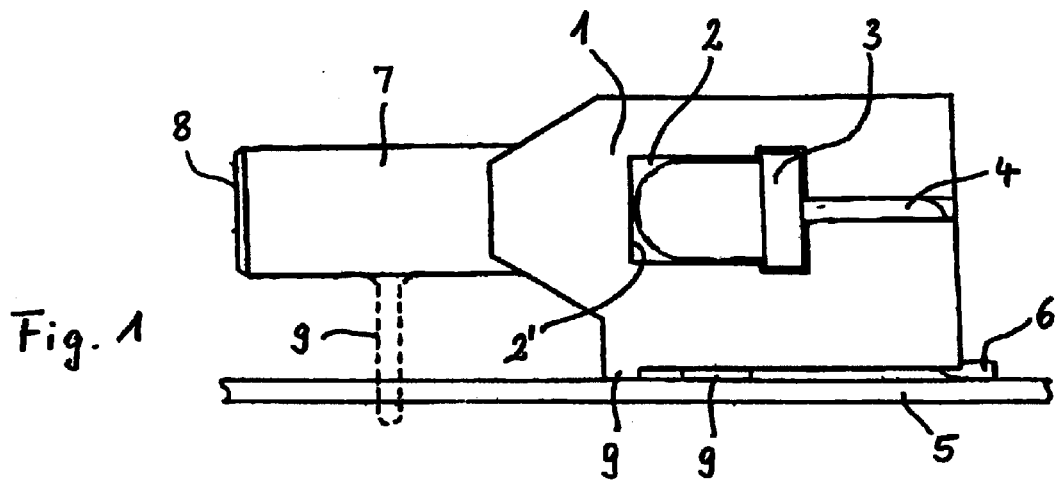
FIG. 1 shows a side view of a display element according to the invention.
Figure 2:
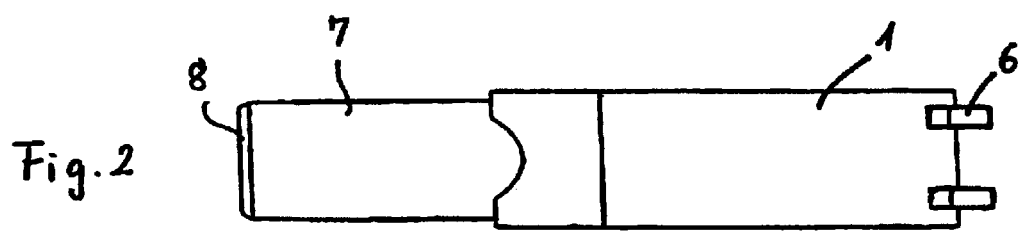
FIG. 2 shows a plan view of the display element of FIG. 1.

The display element illustrated in FIGS. 1 and 2 comprises an optical waveguide 1, which accommodates an LED 3 inserted via a corresponding lateral opening 2, the connecting wires 4 of which LED are routed out of the optical waveguide 1 by being bent twice and have feet 6 which can be soldered onto a printed circuit board 5 by means of SMD technology. The bent connecting wires 4 hold the LED 3 in the optical waveguide 1. The opening 2 forms a light coupling-in area 2' for light emitted by the LED 3.

The otherwise substantially parallelepipedal optical waveguide 1 has, at the front, an substantially cylindrical extension 7 with a planar or round light exit area 8 at the front, the opening 2 with the LED 3 preferably being arranged substantially in the axis of the cylindrical extension 7. Light emitted by the LED 3 is thus guided in a relatively rectilinear manner to the light exit area 8, since light exit area 8 and light coupling-in area 2' are situated substantially opposite one another.

In this case, as in the case of the other embodiments, too, the extension 7 can be given various configurations in terms of its length, its cross section and the configuration of the light exit area 8, an interchangeable insert in the mould expediently being used for this purpose during the production of the optical waveguide 1 by injection-moulding. This enables the display element to be adapted to different installation conditions and user (wishes).

In general, the optical waveguide 1 and, if appropriate, its extension 7 may have supporting elements 9 which are supported or fixed on the printed circuit board 5 or are plugged into corresponding holes in the printed circuit board 5.

The connecting wires 4 may also be designed to be plugged through corresponding holes in the printed circuit board 5.

Figure 3:
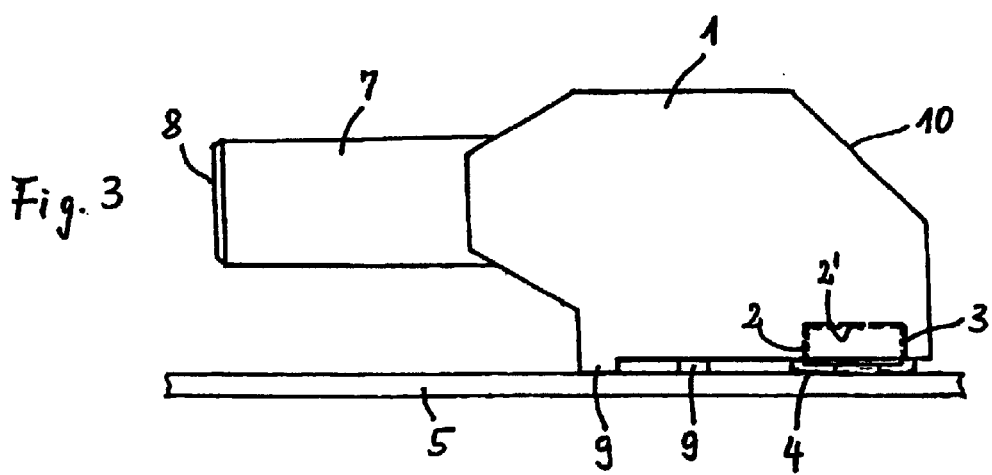

An upwardly emitting LED 3 is provided in the embodiment illustrated in FIG. 3, which LED may be adhesively bonded, or fixed in some other way, in a corresponding recess—accessible from the bottom side of the optical waveguide 1—in the substantially parallelepipedal optical waveguide 1 provided with an extension 7 at the front. Opposite from the LED 3, the optical waveguide 1 is provided with a slanted (in particular 45°) reflecting area 10, which reflects light emitted by the LED 3 into the extension 7 to the light exit area 8 thereof. In this case, too, supporting elements 9 may be provided, while the LED 3 can be connected via corresponding connections 4 to the printed circuit board 5 by means of SMD technology.

In the embodiment illustrated in FIG. 4, the optical waveguide 1 has a curvature ensuring that the light emitted by the LED 3 into the optical waveguide 1 is reflected at its inner wall as far as the light exit area 8. In this case, the optical waveguide 1 is supported on the printed circuit board 5 by a foot-like supporting element 9.

In the embodiment illustrated in FIG. 5, a laterally emitting LED 3 is provided in the recess 2, which is accessible from the bottom and rear side of the optical waveguide 1, and is fixed by being adhesively bonded therein. Although the LED 3 is not aligned any more accurately with respect to the extension 7 in this exemplary embodiment, with the LED 3 switched on enough light passes into the said extension to be able to effect a display. In this case, the optical waveguide 1 is also supported on the printed circuit board 5 by a foot-like supporting element 9 which is plugged into the said printed circuit board, as may also be the case in the other embodiments.

As is illustrated in FIG. 6, a relatively thin-walled, U-shaped screen 11 made of opaque material may be arranged on the optical waveguide 1 in order to prevent scattered light from escaping, if this would adversely affect adjacent display elements. If a plurality of display elements are arranged next to one another, a comb-like screen 11 extending over and between the display elements may be provided, cf. FIG. 7. In this case, webs 12 of the screen 11 between the display elements may have a width or shaping corresponding to the grid spacing of the display elements. The screen 11 may be seated by means of a clamping fit, for example, on the display element or elements or be clipped thereon or latched thereto or adhesively bonded thereto, thereby forming a structural part made from a plurality of display elements.

As is evident from FIG. 8, it is also possible for a plurality of display elements with upwardly emitting LEDs 3 to be arranged one above the other, the optical waveguide 1' of the display element constructed above another display element substantially being L-shaped and likewise carrying a corresponding extension 7. A screen 11 may likewise be arranged between these display elements, FIG. 9, which screen connects the display elements to one another.

If wired LEDs 3 are used, the optical waveguides 1 may also be arranged one above the other and the connecting wires 4 may be correspondingly bent, so that their feet 6 are situated in the same plane for connection to a printed circuit board 5, cf. FIG. 10.

In the embodiment illustrated in section in FIG. 11, two display elements are arranged one above the other, the lower display element, arranged adjacent to the edge of the printed circuit board 5, being formed substantially in a manner corresponding to FIG. 3 and having a plug connection element 13 in the region of the optical waveguide 1, adjacent to its extension 7, which plug connection element engages with a corresponding plug connection element 14 on the extension 7 of the L-shaped optical waveguide 1' situated above it. Moreover, in this case the undersides of both optical waveguides 1, 1' are provided with slotted plug-in feet 15, grooved on the outside, for plugging into corresponding openings in the printed circuit card 5. The extensions 7 are inserted by their free end regions into corresponding openings in a front plate 16 arranged perpendicularly to the printed circuit board 5. In this case, the plug-in foot 15 of the lower optical waveguide 1 is arranged in the region adjacent to the extension 7, while the plug-in foot of the upper optical waveguide 1' is arranged on that side of the optical waveguide 1' which is remote from the extension.

In the embodiment illustrated in FIG. 11, there is a slot arranged in the optical waveguide 1' adjacent to the optical waveguide 1, a screen 11 being plugged into the said slot in order substantially to avoid the overspill of scattered light from one optical waveguide to the other.

Figure 12:
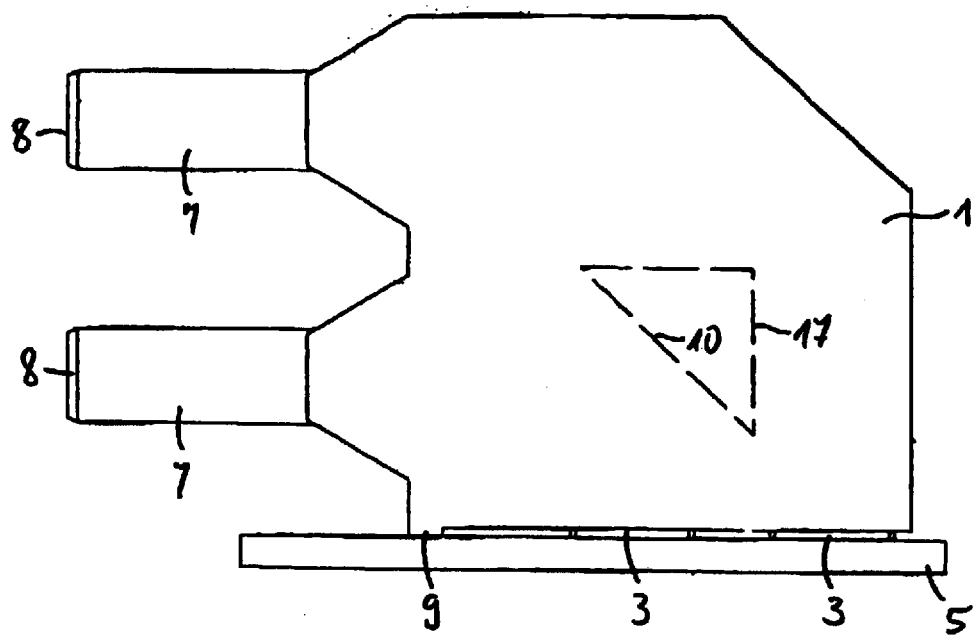
FIGS. 12 and 13 show side views of two embodiments of display elements of the invention which are combined with one another.

In accordance with FIG. 12, provision is made of an integral optical waveguide 1 having a plurality of extensions 7 and thus a plurality of light exit areas 8, each of which is assigned an LED 3. In the exemplary embodiment illustrated, two light exit areas 8 (with two associated LEDs 3) are provided one above the other, but it is also possible to provide more than two, to be precise above one another and next to one another. If appropriate, it is possible to provide a cutout 17 in the optical waveguide 1, the said cutout supplying a reflecting area 10.

Figure 13:
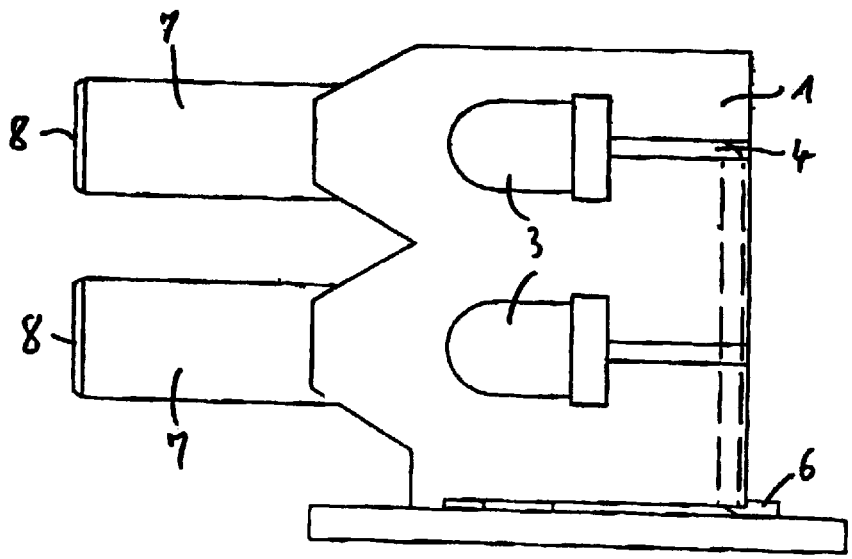

The embodiment illustrated in FIG. 13 represents an embodiment corresponding to FIG. 12 having wired LEDs 3.

Figure 14:
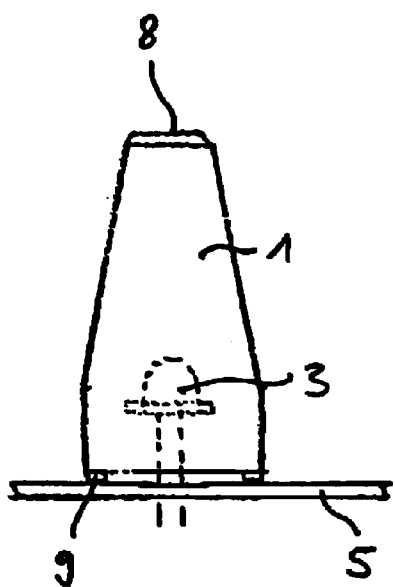
FIGS. 14 and 15 show two embodiments of display elements of the invention arranged upright on a printed circuit card.
Figure 15:
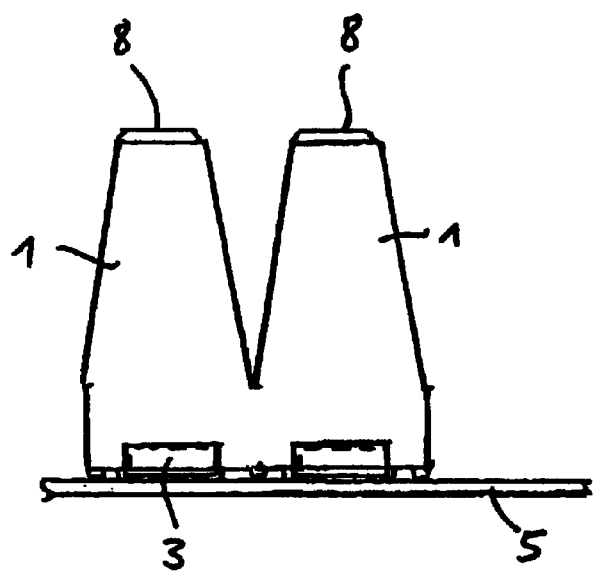

In the case of a front plate 16 running parallel to the printed circuit board 5, the at least one light exit area 8 of the optical waveguide 1 may also be arranged above the LED 3. Embodiments of this type are illustrated in a single and in a combined multiple arrangement in FIGS. 14 and 15. In these embodiments, the respective optical waveguides 1 run in a tapering manner, in particular conically, to the light exit area 8. It is unnecessary for the light to be deflected in these embodiments.

Instead of a screen 11, it is also possible for the corresponding walls of the optical waveguide 1 which might emit interfering scattered light to be made opaque by means of a corresponding layer which is produced for instance by printing, encapsulation by injection-moulding or by some other way of coating by means of a resist or the like.

The optical waveguide 1 may be correspondingly coloured in order to be able to provide different colours for the light exit areas 8. The light emitted by the respective LED 3 need not be white, but may also be coloured, in which case the colour intensity may be amplified, if appropriate, by the choice of coloration for the optical waveguide 1.

The supporting elements 9 may be formed in one piece with the optical waveguide 1 or be fixed thereto. They may, as required, lead through the printed circuit board 5, be suitably fixed on the latter or only be supported on the latter, in order to ensure a good upright position of the display element on the printed circuit board 5 and also, if appropriate, additional fixing.

The LED 3 used in each case may have two or more electrical connections 4, which are suitable for the respective fixing technique on the printed circuit board 5.

Since optical waveguide and LED form a structural unit, it is not necessary for the optical waveguide to be subsequently placed and fixed on the printed circuit board. This not only reduces mounting work but also leads to less space being required on the printed circuit board.

While the invention has been shown and described with reference to the preferred embodiments, it should be apparent to one ordinary skilled in the art that many changes and modifications may be made without departing from the spirit and scope of the invention as defined in the claims.

What is claimed is:

1. A display element capable of being mounted on a printed circuit board, comprising:
   at least one LED provided with connecting wires;
   a device for illuminating a light exit area extending substantially perpendicularly to the direction of light propagation;
   an optical waveguide forming said illuminating device and the light exit area,
   wherein said optical waveguide has a recess, which has a light coupling-in area for light from the at least one LED and in which the at least one LED is fixed,
   said optical waveguide having at least one supporting element for support on a printed circuit board;
   wherein the connecting wires of the at least one LED have feet which can be soldered onto the printed circuit board by means of SMD (surface mount device) technology, said at least one supporting element being spaced laterally from the LED and adapted to cooperate with the LED feet to support the display element on the printed circuit board during soldering.

2. The display element of claim 1, wherein the optical waveguide is substantially parallelepipedal.

3. The display element of claim 1, wherein the optical waveguide has an extension at the front, said extension forming the light exit area.

4. The display element of claim 3, wherein the extension is cylindrical or prismatic.

5. The display element of claim 1, wherein the light coupling-in area is arranged substantially opposite the light exit area.

6. The display element of claim 1, wherein the LED has connecting wires which are routed in bent fashion out of the recess accommodating the LED.

7. The display element of claim 1, wherein the LED is an LED emitting light at the top.

8. The display element of claim 7, wherein the optical waveguide has an at least substantially slanted reflecting area situated opposite the LED.

9. The display element of claim 1, wherein the optical waveguide has an extension at the front, said extension forming the light exit area, and wherein the optical waveguide has a reflective curvature from the light coupling-in area to the light exit area.

10. The display element of claim 1, wherein the optical waveguide has an extension at the front, the said extension forming the light exit area, and wherein the optical waveguide is substantially L-shaped and is constructed above at least one further optical waveguide substantially in parallelepipedal form.

11. A display element capable of being mounted on a printed circuit board, comprising:
    at least one LED provided with connecting wires;
    a device for illuminating a light exit area extending substantially perpendicularly to the direction of light propagation;
    an optical waveguide forming said illuminating device and the light exit area,
    wherein said optical waveguide has a recess, which has a light coupling-in area for light from the at least one LED and in which the at least one LED is fixed,
    wherein the LED is a laterally emitting LED arranged in a recess in the optical waveguide which is open at the bottom;
    said optical waveguide having at least one supporting element for support on a printed circuit board; and
    wherein the connecting wires of the at least one LED have feet which can be soldered onto the printed circuit board by means of SMD (surface mount device) technology.

12. A display element capable of being mounted on a printed circuit board, comprising:
    at least one LED provided with connecting wires;
    a device for illuminating a light exit area extending substantially perpendicularly to the direction of light propagation;
    an optical waveguide forming said illuminating device and the light exit area,
    wherein the optical waveguide has at least two light exit areas with correspondingly assigned LEDs,
    wherein said optical waveguide has a recess, which has a light coupling-in area for light from the at least one LED and in which the at least one LED is fixed,
    said optical waveguide having at least one supporting element for support on a printed circuit board; and
    wherein the connecting wires of the at least one LED have feet which can be soldered onto the printed circuit board by means of SMD (surface mount device) technology.

13. The display element of claim 1, wherein a supporting element can be plugged into the printed circuit board.

14. The display element of claim 1, wherein the at least one supporting element is formed in one piece with the optical waveguide.

15. A display element capable of being mounted on a printed circuit board, comprising:
    at least one LED provided with connecting wires;
    a device for illuminating a light exit area extending substantially perpendicularly to the direction of light propagation;
    an optical waveguide forming said illuminating device and the light exit area,
    wherein said optical waveguide has a recess, which has a light coupling-in area for light from the at least one LED and in which the at least one LED is fixed,
    said optical waveguide having at least one supporting element for support on a printed circuit board;
    wherein a screen engaging over the optical waveguide is provided,
    wherein the connecting wires of the at least one LED have feet which can be soldered onto the printed circuit board by means of SMD (surface mount device) technology.

16. The display element of claim 15, wherein the screen is formed in a manner such that it engages over a plurality of optical waveguides in a comb-like manner.

17. A display element capable of being mounted on a printed circuit board, comprising:
    at least one LED provided with connecting wires;
    a device for illuminating a light exit area extending substantially perpendicularly to the direction of light propagation;
    an optical waveguide forming said illuminating device and the light exit area,
    wherein said optical waveguide has a recess, which has a light coupling-in area for light from the at least one LED and in which the at least one LED is fixed, said optical waveguide having at least one supporting element for support on a printed circuit board and wherein the optical waveguide is provided with an opaque coating at least at an area which emits interfering scattered light;

wherein the connecting wires of the at least one LED have feet which can be soldered onto the printed circuit board by means of SMD (surface mount device) technology.

18. The display element of claim 1, wherein the optical waveguide is coloured.

19. A surface mountable LED package comprising:

at least one LED having a first surface and a second surface opposite to the first surface, and two surface mounted devices electrical contacts on the first surface adapted for soldering the at least one LED on a printed circuit board; and a light emitting member provided with a light receiving surface adjacent to the second surface of the at least one LED, a light emitting surface and a light reflecting surface opposite to the light receiving surface and directing light substantially perpendicular to the light emitting surface;

wherein the light emitting member is provided with a recess housing for the at least one LED so that the second surface of the at least one LED opposes the light receiving surface of the light emitting portion; and wherein the light emitting member is an optical waveguide provided with at least one supporting element spaced laterally from the LED and adapted to cooperate with the LED to support the optical waveguide on a printed circuit board during soldering of the LED.

20. A display element capable of being mounted on a printed circuit board, comprising:

at least one LED provided with connecting wires;

a device for illuminating a light exit area extending substantially perpendicularly to the direction of light propagation;

an optical waveguide forming said illuminating device and the light exit area, wherein said optical waveguide has a recess, which has a light coupling-in area for light from the at least one LED and in which the at least one LED is fixed, said recess adapted to enclose the LED in a co-linear relationship with the light exit area, the waveguide and LED forming a single structural unit that is adapted to be attached to the printed circuit board via the connecting wires of the LED that extend beyond the recess;

said optical waveguide having at least one supporting element for support on a printed circuit board;

wherein the connecting wires of the at least one LED have feet which can be soldered onto the printed circuit board by means of SMD (surface mount device) technology, said at least one supporting element being spaced laterally from the LED and adapted to cooperate with the LED to support the display element on the printed circuit board during soldering.

21. A display element capable of being mounted on a printed circuit board, comprising:

at least one LED provided with connecting wires;

a device for illuminating a light exit area extending substantially perpendicularly to the direction of light propagation;

an optical waveguide forming said illuminating device and the light exit area, wherein said optical waveguide has a recess, which has a light coupling-in area for light from the at least one LED and in which the at least one LED is fixed, said optical waveguide having at least one supporting element for support on a printed circuit board;

wherein the connecting wires of the at least one LED have feet which can be soldered onto the printed circuit board by means of SMD (surface mount device) technology, said at least one supporting element is spaced laterally from the light exit area and is adapted to cooperate with the LED feet to support the display element on the printed circuit board during soldering.

22. The display element of claim 20, further comprising a second supporting element disposed adjacent the light exit area and adapted to support the waveguide over the printed circuit board during soldering.

23. The display element of claim 11, wherein the optical waveguide is open at the bottom end at the rear side.

24. The display element of claim 11, wherein the supporting element can be placed on top of the printed circuit board.

* * * * *